United States Patent
Savoj

(10) Patent No.: US 8,081,715 B1
(45) Date of Patent: Dec. 20, 2011

(54) DEVICE AND METHOD FOR SAMPLING BASED ON MATCHED FILTERING

(75) Inventor: Jafar Savoj, Sunnyvale, CA (US)

(73) Assignee: Marvell International Ltd., Hamilton (BM)

( * ) Notice: Subject to any disclaimer, the term of this patent is extended or adjusted under 35 U.S.C. 154(b) by 1162 days.

(21) Appl. No.: 11/180,652

(22) Filed: Jul. 14, 2005

Related U.S. Application Data

(60) Provisional application No. 60/647,502, filed on Jan. 27, 2005.

(51) Int. Cl.
*H04L 27/06* (2006.01)
(52) U.S. Cl. ........................ 375/340; 340/316
(58) Field of Classification Search .................... 375/340
See application file for complete search history.

(56) References Cited

U.S. PATENT DOCUMENTS

| | | | |
|---|---|---|---|
| 6,275,545 B1* | 8/2001 | Suzuki | 375/343 |
| 6,473,013 B1* | 10/2002 | Velazquez et al. | 341/120 |
| 2002/0097821 A1* | 7/2002 | Hebron et al. | 375/346 |
| 2003/0151450 A1* | 8/2003 | Nguyen et al. | 327/540 |
| 2003/0206061 A1* | 11/2003 | Yamamoto | 330/253 |
| 2004/0151269 A1* | 8/2004 | Balakrishnan et al. | 375/355 |
| 2004/0228424 A1* | 11/2004 | Baldwin et al. | 375/343 |
| 2005/0031046 A1* | 2/2005 | Al-Adani | 375/260 |
| 2005/0105358 A1* | 5/2005 | Schweickert et al. | 365/222 |
| 2005/0117404 A1* | 6/2005 | Savoj | 365/189.05 |
| 2005/0195013 A1* | 9/2005 | Yang et al. | 327/336 |
| 2005/0207936 A1* | 9/2005 | Berryhill et al. | 422/63 |
| 2007/0002727 A1* | 1/2007 | Stessen et al. | 370/210 |

\* cited by examiner

*Primary Examiner* — David C. Payne
*Assistant Examiner* — Tanmay Shah

(57) ABSTRACT

A circuit that reduces the effect of noise in a receiver that includes a plurality of filters and a plurality of samplers. The plurality of filters are configured discreetly filter a digital signal to form a plurality of filtered signals. The plurality of samplers are configured to sample the plurality of filtered signals.

35 Claims, 4 Drawing Sheets

DEVICE AND METHOD FOR SAMPLING BASED ON MATCHED FILTERING

CROSS-REFERENCE TO RELATED APPLICATIONS

This application claims priority under 35 U.S.C. §119(e) to provisional U.S. Patent Application No. 60/647,502, filed on Jan. 27, 2005, the disclosure of which is expressly incorporated by reference herein in its entirety.

BACKGROUND

1. Field of the Invention

The invention is directed to a device and method for improved quality of signal detection using filters, and in particular, improved quality of signal detection in noisy environments with receivers such as wireline receivers using matched filter circuits.

2. Related Art

Many devices, such as receivers or wireline receivers, operate in noisy environments. The noise of such environments reduces the signal-to-noise ratio (SNR) and also increases the bit error rate (BER) along with other detrimental effects. In this regard, a conventional receiver will sample data at one instance. If this instance includes noise, the sample may not be satisfactory.

Accordingly, there is a need for an improved device, circuit, and method for use in wireline receivers that may achieve a higher signal-to-noise ratio, and a reduced bit error rate, along with other apparent benefits.

SUMMARY OF THE INVENTION

The invention meets the foregoing need and allows for improved signal reception in noisy environments that results in significantly better reception in the device and other advantages apparent from the discussion herein.

Accordingly, in one aspect of the invention a circuit includes a plurality of filters arranged in parallel and configured to each filter a different portion of a digital signal to form a plurality of filtered signals, and a plurality of samplers to sample at least one of the plurality of filtered signals. A receiver may include the circuit noted above.

The circuit may include an equalizer configured to amplify the digital signal prior to filtering. The plurality of filters may at least one of integrate and sum the digital signal to form the plurality of filtered signals in response to at least one enable signal. The plurality of filters may one of integrate and sum during the enable signal. The plurality of filters may be configured to store the plurality of filtered signals in response to at least one enable signal. The plurality of filters may be responsive to clear one of the plurality of filtered signals stored in response to at least one reset signal. The plurality of filters may be matched filters. The number of the plurality of filters and the number of the plurality of samplers may be the same. The plurality of filters each may include at least one of a differential switch pair responsive to the digital signal and an integrator that integrates the digital signal. The plurality of filters each may include a current source that provides current to the integrator and a bias circuit configured to provide a current definition to the current source. The differential switch pair may include at least two switches that receive the digital signal at a gate of each of the at least two switches. The integrator may include at least one capacitor and the bias circuit may include at least one dummy transistor. The plurality of samplers may include an enabling circuit that enables the samplers. The plurality of samplers may include an enabling circuit to enable the sampler to sample, and at least one of an input differential switch pair that receives at least one of the plurality of filtered signals and a booster circuit that boosts at least one of the plurality of filtered signals.

In yet another aspect of the invention a method of filtering includes a) discreetly filtering a first portion of a digital signal, b) discreetly filtering a second portion of the digital signal, c) sampling the filtered signal of step a), and d) sampling the filtered signal of step b). A receiver may operate according to the above-noted method.

The method may include equalizing the digital signal prior to the step of discreetly filtering. The step of discreetly filtering may include one of integrating and summing the digital signal in response to at least one enable signal. The step of one of integrating and summing the digital signal may occur during the at least one enable signal. The step of discreetly filtering may include storing the plurality of filtered signals in response to at least one enable signal. The method further may include the step of clearing at least one of the stored filtered signals in response to at least one reset signal. The steps of discreetly filtering may include matched filtering. An equal number of discreetly filtering and sampling steps may be performed.

In yet another aspect of the invention a circuit includes a plurality of means, arranged in parallel, for filtering a different portion of a digital signal to form a plurality of filtered signals, and a plurality of means for sampling at least one of the plurality of filtered signals. A receiver may include the circuit noted above.

The circuit further may include means for equalizing the digital signal prior to filtering. The circuit further may include means for one of integrating and summing the digital signal to form the plurality of filtered signals in response to at least one enable signal. The means for one of integrating and summing may one of integrate and sum during the enable signal. The circuit further may include means for storing the plurality of filtered signals in response to at least one enable signal. The circuit further may include means for clearing at least one of the plurality of filtered signals stored in response to at least one reset signal. The means for filtering may include means for matched filtering. The number of the plurality of filtering means and the number of the plurality of sampling means may be the same. The plurality of filters each may include means for differentiating the digital signal and means for integrating the digital signal. The means for filtering may further include means for providing current to the integrator and means for providing a current definition to the current providing means. The means for differentiating may include at least two switches that receive the digital signal to a gate of each of the at least two switches. The means for integrating may include at least one capacitor, and the means for providing a current definition may include at least one dummy transistor. The means for sampling may include means for enabling the sampler. The means for sampling may include at least one of an input differential switch pair that receives at least one of the plurality of filtered signals and means for boosting at least one of the plurality of filtered signals.

Additional features, advantages, and embodiments of the invention may be set forth or apparent from consideration of the following detailed description, drawings, and claims. Moreover, it is to be understood that both the foregoing summary of the invention and the following detailed description are exemplary and intended to provide further explanation without limiting the scope of the invention as claimed.

BRIEF DESCRIPTION OF THE DRAWINGS

The accompanying drawings, which are included to provide a further understanding of the invention, are incorporated in and constitute a part of this specification, illustrate embodiments of the invention and together with the detailed description serve to explain the principles of the invention. No attempt is made to show structural details of the invention in more detail than may be necessary for a fundamental understanding of the invention and the various ways in which it may be practiced. In the drawings.

DETAILED DESCRIPTION OF THE INVENTION

Figure 1:
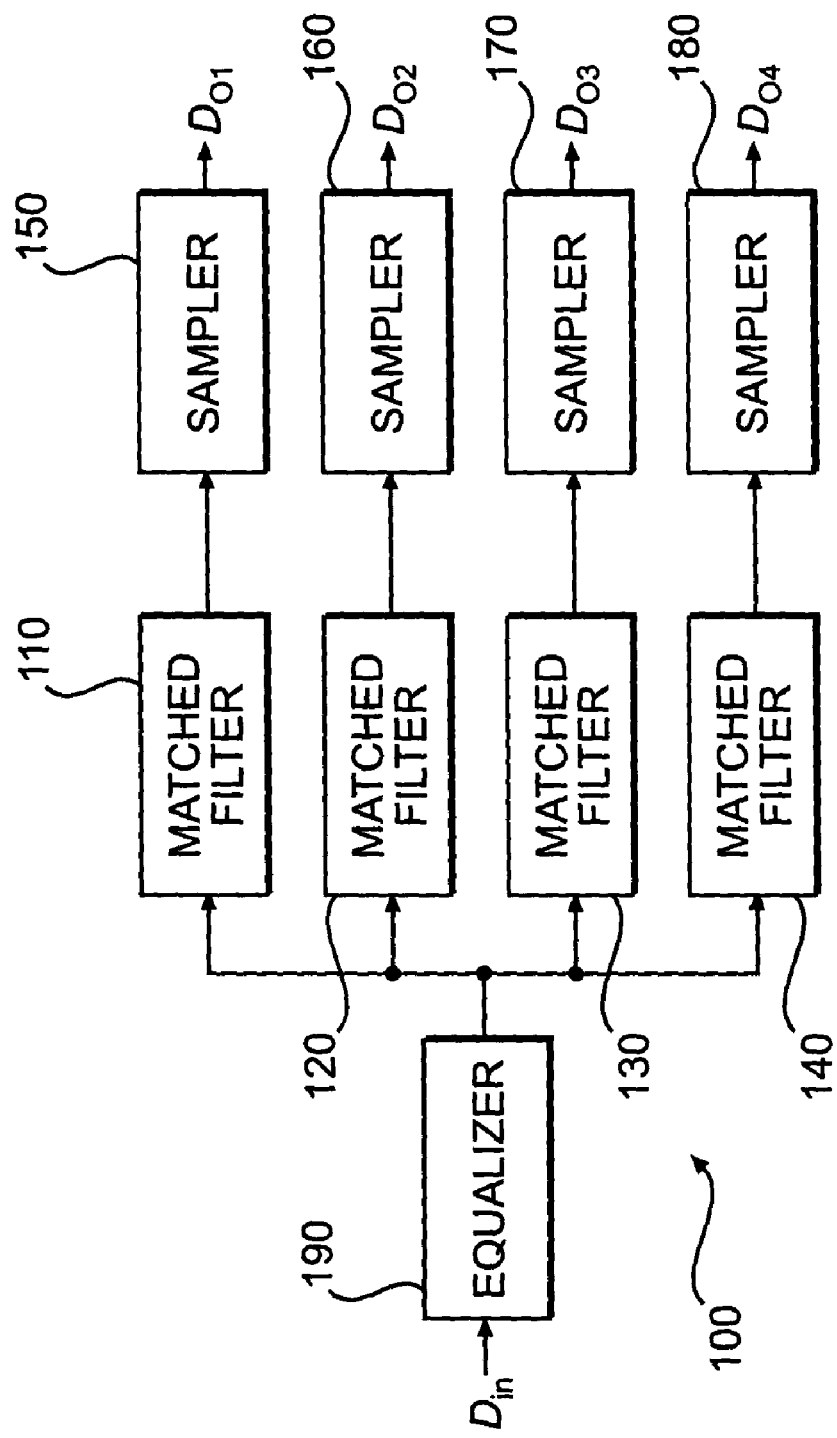
FIG. 1 is an exemplary circuit layout of a parallel sampling scheme with matched filter circuits constructed according to the principles of the invention.

The embodiments of the invention and the various features and advantageous details thereof are explained more fully with reference to the non-limiting embodiments and examples that are described and/or illustrated in the accompanying drawings and detailed in the following description. It should be noted that the features illustrated in the drawings are not necessarily drawn to scale, and features of one embodiment may be employed with other embodiments as the skilled artisan would recognize, even if not explicitly stated herein. Descriptions of well-known components and processing techniques may be omitted so as to not unnecessarily obscure the embodiments of the invention. The examples used herein are intended merely to facilitate an understanding of ways in which the invention may be practiced and to further enable those of skill in the art to practice the embodiments of the invention. Accordingly, the examples and embodiments herein should not be construed as limiting the scope of the invention, which is defined solely by the appended claims and applicable law. Moreover, it is noted that like reference numerals represent similar parts throughout the several views of the drawings.

FIG. 1 shows a receiver 100 with a sampling device that includes a first sampler circuit 150, a second sampler circuit 160, a third sampler circuit 170, and a fourth sampler circuit 180. Each of the sampler circuits 150, 160, 170, and 180 sample data that is received by the receiver 100. Moreover, each of the sampler circuits 150, 160, 170, and 180 then output a specific component of the sampled data as data streams $D_{01}$, $D_{02}$, $D_{03}$, and $D_{04}$. Additionally, although specific reference is made to sampler circuits, any circuit or device capable of capturing discrete portions of data may be employed including demultiplexers. Moreover, only four sampler circuits are shown in the receiver 100 of FIG. 1 for brevity. Any number of sampler circuits may be employed and is therefore contemplated by the invention.

In a particular embodiment, the sampler circuits 150, 160, 170, and 180 operate at a sampling rate substantially equal to $\frac{1}{4}^{th}$ of the data rate of data stream $D_{in}$ or a 25% duty cycle to an input rate of data input to the sampler circuits. As noted above, any number of sampler circuits may be employed and is therefore contemplated by the invention. Furthermore, changing the number of sampler circuits may likewise result in a change in the sampling rate or sampling duty cycle. More specifically, the sampling rate will be 1/n, where n is the number of sampler circuits.

FIG. 1 also shows an equalizer 190. Data for the receiver 100 shown in FIG. 1 is received in the equalizer 190 as data stream $D_{in}$. In this regard, the data stream $D_{in}$ received in the receiver 100 may be received in equalizer 190. In operation, the equalizer 190 operates as a limiting amplifier. In other words, the equalizer 190 pre-amplifies the data before the data enters the remaining parts of the receiver 100 shown in FIG. 1. Although FIG. 1 shows an equalizer 190, any type of device may be employed to boost the high frequency content of the data, such as a booster. Moreover, the content of the data stream signal $D_{in}$ may require no boosting, equalizing, or amplifying. Accordingly it is contemplated that there may not be a need for such a component, and in such a case, the equalizer would be optional.

Data stream $D_{in}$ enters equalizer 190, is equalized and is output to each of a plurality of a four matched filter circuits 110, 120, 130, and 140. It should be noted that only four matched filter circuits are shown in FIG. 1 merely for brevity. Any number of matched filter circuits may be employed in the receiver 100 shown in FIG. 1. Accordingly, it is contemplated that the device can include any number of matched filter circuits and sampler circuits arranged with a substantially parallel construction. Moreover, any number of matched filter circuits and sampler circuits may be used as is required or allowed with any known protocol, any future enhancement of a protocol, or any future protocol using digital transmission that is demultiplexed. Furthermore, although an equal number of matched filter circuits and sampler circuits are shown in the construction of the receiver 100 of the FIG. 1 embodiment, it is contemplated that a sampler circuit may sample plural filter circuits. Conversely, plural sampler circuits could sample a single filter circuit that is filtering a plurality of signals.

In a particular embodiment, the data may enter the receiver 100 shown in FIG. 1 as data stream $D_{in}$, and the data may be input to equalizer 190. This data may be amplified and then output to each of the matched filter circuits 110, 120, 130, and 140. All of the data from equalizer 190 may then enter the matched filter circuits 110, 120, 130 and 140 and may be selectively filtered.

More specifically, a bit of data from data stream $D_{in}$ may enter the first matched filter circuit 110 and may be selectively filtered in response to an enable signal. Another bit of data from data stream $D_{in}$ may enter matched filter circuit 120 and may be selectively filtered in response to another enable signal that is offset from the first enable signal. The third and fourth bits of the data of the data stream $D_{in}$ may be accordingly also filtered by the third matched filter circuit 130 and fourth matched filter circuit 140, respectively, in response to other respective enable signals. Accordingly, when there are four matched filter circuits each matched filter circuit 110, 120, 130, and 140 may filter every fourth bit of data so that all of the data is filtered.

The data stream $D_{in}$ may be a square pulse and each of the matched filter circuits 110, 120, 130, and 140 may be configured as an integrator. Accordingly, as each of the matched filter circuits 110, 120, 130, and 140 filters a respective bit of the data stream $D_{in}$, the respective bit may be integrated and this integral of the signal may provide a subsequent sampler circuit with the integral or sum of the bit which includes the noise. In this regard, the matched filter circuits 110, 120, 130, and 140 may average the noise over a bit period and may improve the SNR by as much as about 3 dB.

After the data stream $D_{in}$ is selectively filtered by the matched filter circuits 110, 120, 130, and 140, the filtered output may then be sampled by each of the sampler circuits, 150, 160, 170, and 180. In this regard, sampler circuit 150 may sample the signal that has been filtered by matched filter circuit 110 in response to an enable signal. Similarly, sampler circuits 160, 170, and 180 may each then similarly sample the filtered signals from matched filter circuits 120, 130, and 140 in response to other enable signals respectively. In other words, in this embodiment of the receiver 100, the matched filter circuits 110, 120, 130, and 140, and the sampler circuits, 150, 160, 170, and 180 are arranged substantially as a parallel circuit and will concurrently sample the data stream $D_{in}$.

When the matched filter circuits 110, 120, 130, and 140 are implemented as integrators, the bit that is sampled by sampler circuits 150, 160, 170, and 180 may be an integrated sampling of the entire bit. The resultant output from sampler circuits 150, 160, 170, and 180 is shown as $D_{O1}$, $D_{O2}$, $D_{O3}$, and $D_{O4}$. Accordingly, for a data signal that was input as data stream $D_{in}$ that included noise, the output $D_{O1}$, $D_{O2}$, $D_{O3}$, and $D_{O4}$ that is output by sampler circuits 150, 160, 170, and 180 may have improved signal noise ratio (SNR) and bit-error rate (BER) over a signal that was input without filtering. As noted above, the matched filter circuits 110, 120, 130 and 140 average the noise over a one-bit period and may improve the signal-to-noise ratio by about 3 dB.

It should be noted that although FIG. 1 shows the receiver 100 having different components, this is merely for illustrative simplicity. In this regard, each of these components may be combined to form fewer components having the same or a substantially similar function. Moreover, each of the components of the receiver 100 may also be divided to form more components having substantially the same function.

Figure 2:
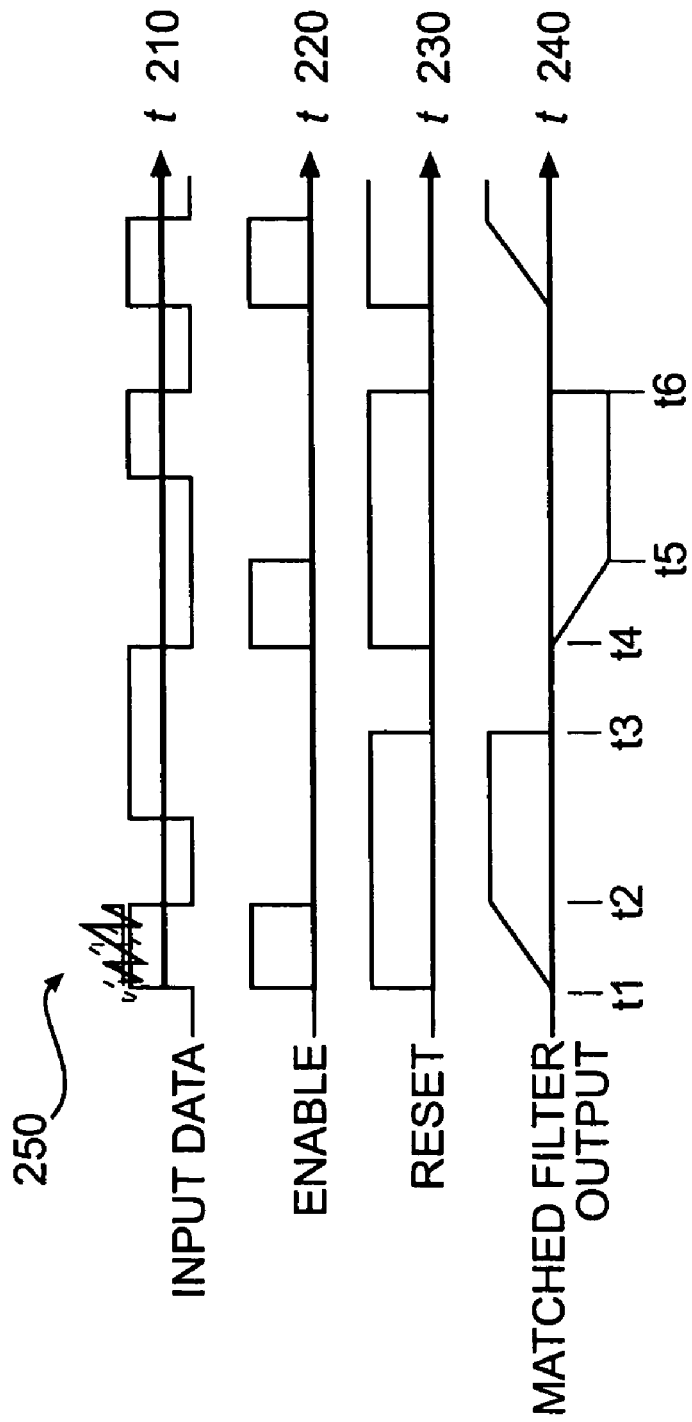
FIG. 2 shows exemplary wave forms used in an operation of the circuit constructed according to the principles of the invention.

FIG. 2 shows sampling wave forms associated with the operation of the receiver 100 of FIG. 1. In particular, an input data line 210 shows the input data stream $D_{in}$ that is input to the equalizer 190 and/or input to one of the matched filter circuits 110, 120, 130 and 140. In this case, the input data is the data stream $D_{in}$ shown in FIG. 1. The input data line 210 shown in FIG. 2 shows some amount of noise in the signal that is illustrated, for exemplary purposes only, as noise 250. The amount of noise 250 will be dependent on a variety of reasons including various environmental, physical, and other factors and/or conditions or the like.

In sampling the input data stream 210 such as data stream $D_{in}$, a first step is to enable one of the matched filter circuits 110, 120, 130, and 140 to filter a bit or portion of data stream $D_{in}$. The enable signal is shown as a function of time as the enable line 220. In this regard, each of the matched filter circuits 110, 120, 130, and 140 may have an enable signal line 220 operating at a different phase such that each of the matched filter circuits 110, 120, 130, and 140 may sample a different one of every four bits. In other words, the enable signal may be offset for each of the matched filter circuits so that when the enable signal for one of the matched filter circuits goes high, the others remain low. Alternatively, the matched filter circuits 110, 120, 130, and 140 may only recognize every $n^{th}$ enable signal (where n=the number of filters).

As shown in FIG. 2, the enable line 220 may go high at time t1. At time t1, a leading edge of the enable signal shown in line 220 going high may start a filtering of a specific matched filter circuit associated with that enable signal to integrate a bit of the data in data stream $D_{in}$.

As further shown in FIG. 2, the matched filter circuit output is shown as line 240. As the enable signal goes high in line 220, the matched filtered output 240 may start to integrate or sum the input data regardless of any noise such as noise 250. As further shown in FIG. 2, the input data line 210 at a left portion of the timing diagram presents a logical high input data signal on line 210. The resultant matched filter circuit output 240 is an integration of the input data line 210 that results in an upwards ramp (approximately during time t1 through time t2). When the enable signal in line 220 goes low at time t2, a trailing edge thereof may trigger a hold in the matched filter circuit such that the output signal 240 that is output by one of the matched filter circuits 110, 120, 130, and 140 will be maintained for sampling. In other words, the matched filter circuit 110, 120, 130, and 140 may stop integrating the signal and may hold the sample between time t2 and time t3 as is shown in line 240. It should be noted that the enable signal shown in line 220 is operating at a 25% duty cycle, i.e. it pulses $\frac{1}{4}^{th}$ the time of the data rate with the four matched filter circuits 110, 120, 130, and 140, and the respective four sampler circuits 150, 160, 170, 180. It is contemplated though, that a greater or lesser number of matched filter circuits and associated sampling devices may used with an appropriate duty cycle of the enable signal shown in line 220.

Further, in FIG. 2, once the matched filter circuit has integrated the signal and the enable signal in line 220 has gone low at time t2, the matched filter circuit may hold the output and the output is then sampled by one of the sampler circuits 150, 160, 170 and 180. Once the data input has been sampled by the sampler circuits 150, 160, 170, and 180, then the data signal that is being held by one of the matched filter circuits 110, 120, 130, and 140 may then be cleared from the respective matched filter circuit 110, 120, 130, and 140. In this regard, a reset signal shown as line 230 may go low at time t4 and the trailing edge thereof may reset the matched filter circuit output that is being held in a respective one of the sampler circuits 150, 160, 170, and 180 during the sampling process, which has just been described. This allows a repeat of the sampling process for a subsequent bit of data. In this regard, the subsequent portion of the timing diagram shows a second sampling of the data input of data stream $D_{in}$ in which the input is a low signal at time t4. Again the second enable input may go high on line 220 at time t4, and the matched filtered output may start to integrate on line 240 to integrate the signal from input data stream $D_{in}$ shown in line 210. Once the enable signal goes low again at time t5, the matched filter circuit may hold this signal to be sampled again by one of the sampler circuits 150, 160, 170, and 180 during the time t5 to t6.

When the sampling is complete, again the reset may go low and clear the memory of one of the matched filter circuits 110, 120, 130, and 140 at time t6. Although specific reference has been made to the enable signal going high to initiate integration, the enable signal going low to hold the matched filter circuit integration, and the reset going low to clear the matched filtered output, it is contemplated that any combination of high or low signals on timing lines 220 and 230 may be employed. Moreover, any combination of high signals, low signals, trailing edge, or leading edge can be employed for the enable and/or for the reset signals. In this regard, the logical states shown are for illustrative purposes only; other states may used.

Figure 3:
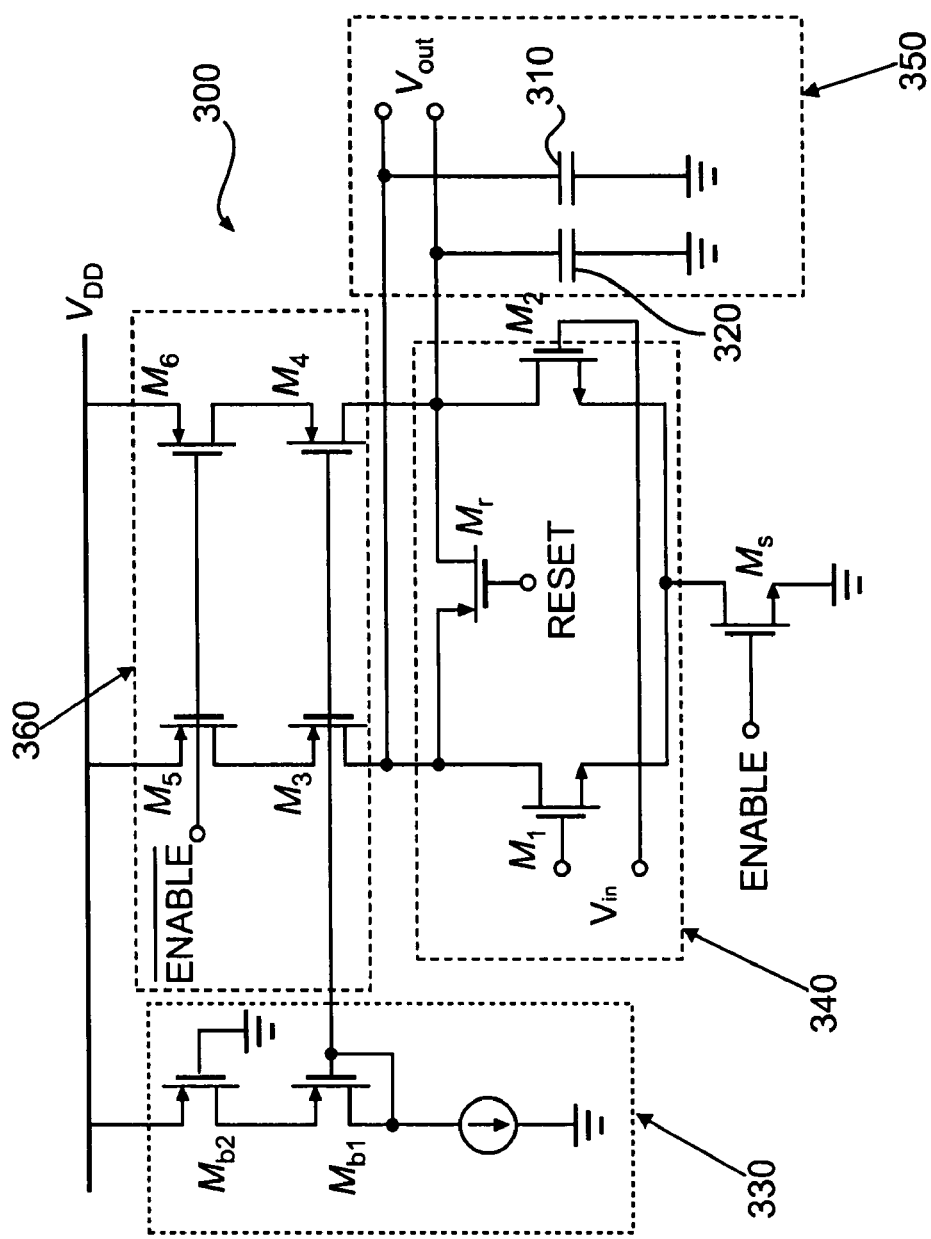
FIG. 3 is an exemplary matched filter circuit constructed according to the principles of the invention.

A matched filter circuit that may be the matched filter circuit 110, 120, 130, and 140 used in conjunction with the receiver 100 shown in FIG. 1 is shown as matched filter circuit 300 in FIG. 3. In particular, the matched filter circuit 300 includes an input differential switch pair circuit 340, which includes an input differential switch pair $M_1$ and $M_2$ receiving an input V. The input $V_{in}$ is connected to the gates of switches $M_1$ and $M_2$. The input $V_{in}$ is an output of the equalizer 190.

Moreover, matched filter circuit 300 also includes a current source circuit 360. The current source circuit 360 includes switches $M_3$ and $M_4$ that form a current source in the matched filter circuit 300 of FIG. 3. When switches $M_5$ and $M_6$ are turned on, they connect a Voltage Drain Drain ($V_{DD}$) to switches $M_3$ and $M_4$.

Moreover, matched filter circuit 300 further includes an integrator circuit 350. The integrator circuit 350 includes two capacitors 310 and 320 that are connected to ground, $V_{out}$, and the current source of switches $M_3$ and $M_4$. The two capacitors 310 and 320 together may in part integrate $V_{in}$ while an enable signal is "high" and store an integral of $V_{in}$ after enable goes "low." A switch $M_s$ is connected to drains of switches M1 and M2. When an enable signal goes high, the switch $M_s$ will close and connect the drains of the switches M1 and M2 to ground.

In operation, when an enable signal goes high, switches $M_5$ and $M_6$ will close and switch $M_s$ will close. Accordingly, the signal $V_{in}$ applied to the gates of $M_1$ and $M_2$ may start to integrate $V_{in}$ in capacitors 310 and 320. When an enable signal goes low, the integrated signal $V_{in}$ applied to the gates of $M_1$ and $M_2$ may be held or stored in the capacitors 310 and 320 and may no longer integrate the signal W. In particular, the output at $V_{out}$ may be frozen by the charge held in each of capacitors 310 and 320.

The matched filter circuit 300 shown in FIG. 3 also has a bias scheme 330 that may include switches $M_{b2}$ and $M_{b1}$. In particular, the bias scheme 310 of FIG. 3 includes a dummy transistor $M_{b2}$. The switch or dummy transistor $M_{b2}$ includes a gate that is tied to ground. Moreover a switch $M_{b1}$ has a drain and a gate that are tied together and also tied to the gates of switches $M_3$ and $M_4$. The bias scheme 310 of FIG. 3 allows the matched filter circuit 300 of FIG. 3 to have a good definition of current. To this extent, $M_{b2}$ has the same dimensions as switch $M_5$ and switch $M_6$ to replicate the impact thereof by the bias scheme 310 in the remaining portion of the circuit. It should be noted that although a specific bias scheme is shown in FIG. 3, any circuit that provides a good definition of current may be employed in the filter circuit 300.

The FIG. 3 matched filter circuit 300 thus can integrate the input $V_{in}$ to the matched filter circuit across capacitors 310 and 320 and allows that value to be held at $V_{out}$ when enable goes low.

Subsequently, it is desirable to clear the value that is held at $V_{out}$ by the matched filter circuit 300. This may be done by providing a "Reset" signal that is shown in FIG. 2 as line 230 to the matched filter circuit FIG. 3. In this regard, the "Reset" signal is input to switch $M_r$. Accordingly, when the "Reset" signal is applied to switch $M_r$, this may connect the capacitors 310 and 320 together to discharge the capacitors accordingly.

Figure 4:
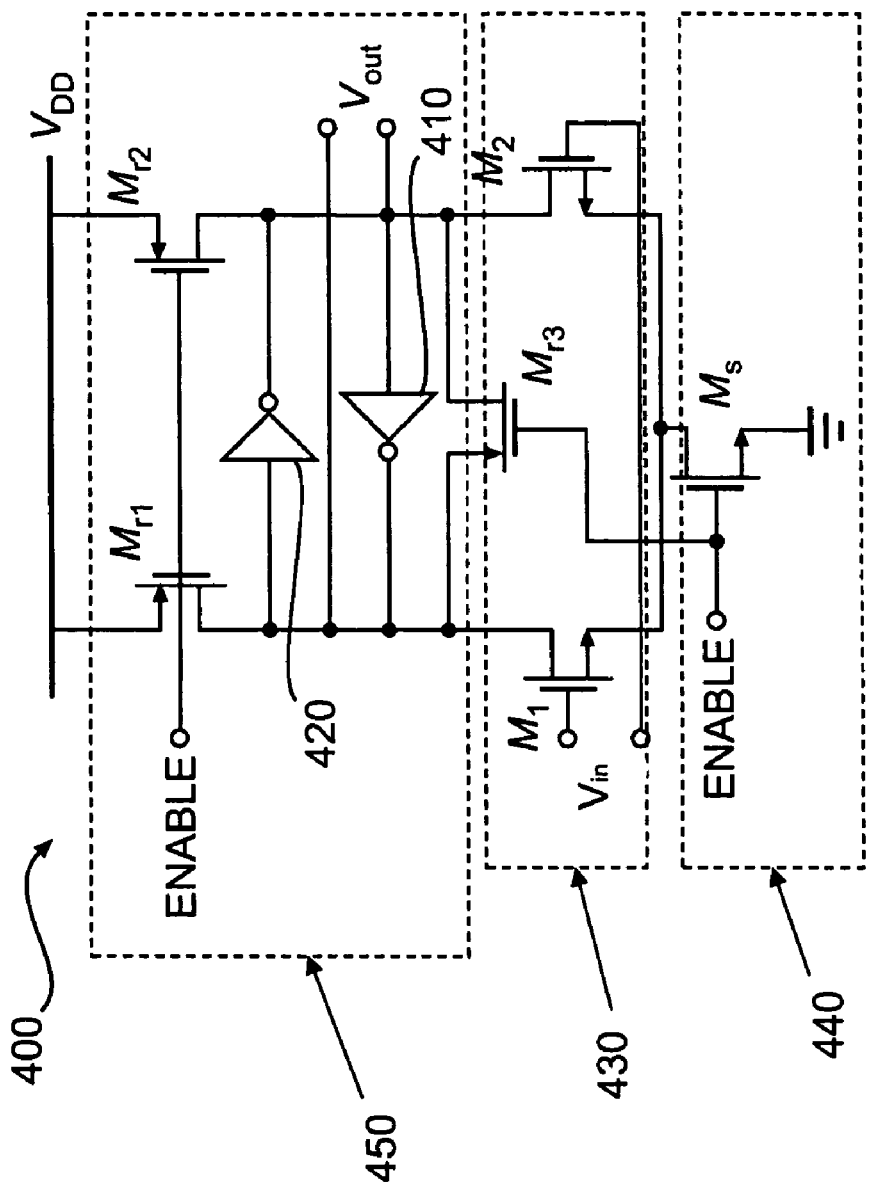
FIG. 4 is an exemplary sampler circuit constructed according to the principles of the invention.

FIG. 4 shows a sampler circuit 400 that may be used in conjunction with the receiver 100 of FIG. 1 as one of the sampler circuits 150, 160, 170 and 180. The sampler circuit 400 may include an input differential pair circuit 430, a boosting circuit 450, and an enabling circuit 440.

In a particular embodiment, switches, $M_1$ and $M_2$ form an input differential pair circuit 430 that receives sample data $V_{in}$. Moreover the sampler circuit 400 includes an enabling circuit 440 that may include a switch $M_s$ that connects the drains of $M_1$ and $M_2$ together, and switch $M_{r3}$ that connects the sources of the switches $M_1$ and $M_2$ together. The switches $M_{R1}$ and $M_{R2}$ connect the switches $M_1$ and $M_2$ to the $V_{DD}$. When the enable signal is applied to the switch $M_s$, $M_{r1}$, $M_{r2}$ and $M_{r3}$, the sampler circuit 400 of FIG. 4 will sample the output $V_{in}$ from one the filters. In particular, switch $M_s$ will allow the sample that is applied at $V_{in}$ to be sampled and $M_{r1}$, $M_{r2}$ will reset the sampler circuit 400 to $V_{DD}$ after the sample has been sampled.

The sampler circuit of FIG. 4 may include a boosting circuit 450, which can include two invertors 410, 420. The invertors 410, 420 are connected back to back and may function to boost the sampled signal applied at W. In this respect, the invertors may take the sampled signal applied at $V_{in}$ and force the signal to the signal's logical high/low to output at $V_{out}$ with an output as one of $D_{O1}$, $D_{O2}$, $D_{O3}$, and $D_{O4}$.

It should be noted that the enable signal, as applied to the FIG. 4 sampler circuit, may be the same enable signal that is applied to the FIG. 3 matched filter. In this regard, the enable signal or the sampler circuit may be one duty cycle or one timeframe after the enable signal to the matched filter. The enable signal also can be a different signal such as the enable signal for the sampler circuit that follows in sequence or duty cycle with that of the matched filter.

While the invention has been described in terms of exemplary embodiments, those skilled in the art will recognize that the invention can be practiced with modifications in the spirit and scope of the appended claims. These examples given above are merely illustrative and are not meant to be an exhaustive list of all possible designs, embodiments, applications or modifications of the invention.

What is claimed:

1. A wireline receiver circuit comprising:
    an input configure to receive a digital signal via a wireline;
    a plurality of filters arranged in parallel and configured to each be enabled during different time periods, respectively, in response to a plurality of enable signals, respectively, in order to select and discretely filter different portions of the digital signal in parallel and output a plurality of filtered signals,
    wherein each filter of said plurality of filters comprises at least one of:
        a differential switch pair responsive to the digital signal, and
        an integrator that integrates the digital signal; and
    wherein each filter of said plurality of filters comprises:
        a current source that provides current to said integrator; and
        a bias circuit configured to provide a current definition to said current source; and
    a plurality of samplers configured to sample different ones of the plurality of filtered signals in parallel to generate another digital signal having at least one of an improved signal-to-noise ratio and bit error rate.

2. The wireline receiver circuit according to claim 1 further comprising:
    an equalizer configured to amplify the digital signal prior to filtering.

3. The wireline receiver circuit according to claim 1 wherein said plurality of filters at least one of integrate and sum the digital signal to form the plurality of filtered signals in response to at least one enable signal.

4. The wireline receiver circuit according to claim 3 wherein said plurality of filters one of integrate and sum during the enable signal.

5. The wireline receiver circuit according to claim 3 wherein said plurality of filters are configured to store the plurality of filtered signals in response to at least one enable signal.

6. The wireline receiver circuit according to claim 5 wherein said plurality of filters are responsive to clear one of the plurality of filtered signals stored in response to at least one reset signal.

7. The wireline receiver circuit according to claim 1 wherein said plurality of filters comprise matched filters.

8. The wireline receiver circuit according to claim 1 wherein the number of said plurality of filters and the number of said plurality of samplers are the same.

9. The wireline receiver circuit according to claim 1 wherein said differential switch pair comprises at least two switches that receive the digital signal at a gate of each of said at least two switches.

10. The wireline receiver circuit according to claim 1 wherein said integrator comprises at least one capacitor and said bias circuit comprises at least one dummy transistor.

11. The wireline receiver circuit according to claim 1 wherein said plurality of samplers comprises an enabling circuit that enables said plurality of samplers.

12. The wireline receiver circuit according to claim 11 wherein said plurality of samplers further comprise at least one of:
 a input differential switch pair that receives at least one of the plurality of filtered signals; and
 a booster circuit that boosts at least one of the plurality of filtered signals.

13. A receiver comprising The wireline receiver circuit according to claim 1.

14. A method of filtering a digital signal comprising:
 a) receiving a digital signal via a wireline;
 b) generating a plurality of enable signals during different time periods;
 c) selecting and discretely filtering different portions of the digital signal in parallel during different time periods, respectively, in response to the plurality of enable signals to output a plurality of filtered signals, wherein the step of selecting and discretely filtering different portions of the digital includes for each portion of the digital signal:
  differentially switching the portions of the digital signal, thereafter integrating the portions of the digital signal, providing current via a current source for said integrating, and
  providing a bias current for providing current definition to said provided current; and
 d) sampling different ones of the plurality of filtered signals in parallel to generate a digital signal having at least one of an improved signal-to-noise ratio and a bit error rate.

15. The method according to claim 14 further comprising: equalizing the digital signal prior to said steps of discreetly selecting and filtering.

16. The method according to claim 14 wherein said step of selecting and discreetly filtering further comprises one of integrating and summing each different portion of the digital signal in response to at least one enable signal.

17. The method according to claim 16 wherein said step of one of integrating and summing occurs during the at least one enable signal.

18. The method according to claim 16 wherein said step of selecting and discreetly filtering further comprise storing the filtered signals in response to at least one enable signal.

19. The method according to claim 18 further comprising the step of clearing at least one of the stored filtered signals in response to at least one reset signal.

20. The method according to claim 14 wherein said step of selecting and discreetly filtering comprises matched filtering each different portion of the digital signal.

21. The method according to claim 14 wherein a number of the different portions selected and filtered in parallel is the same with a number of the different filtered signals sampled in parallel.

22. A receiver operating according to the method claim 14.

23. A wireline receiver circuit comprising:
 means for receiving a digital signal via a wireline;
 means for generating a plurality of enable signals during different time periods;
 means for selecting and discretely filtering different portions of the digital signal in parallel during different time periods, respectively, in response to the plurality of enable signals to output a plurality of filtered signals, wherein said selecting and discretely filtering means includes means for providing current to said integrating means, and means for providing a current definition to said current providing means; and
 means for sampling different ones of the plurality of filtered signals in parallel to generate a digital signal having at least one of an improved signal-to-noise ratio and a bit error rate, wherein a number of the different portions of the digital signal are filtered by said selecting and discretely filtering means and a number of the different filtered signals sampled in parallel by said sampling means are the same.

24. The wireline receiver circuit according to claim 23 further comprising means for equalizing the digital signal prior to filtering.

25. The wireline receiver circuit according to claim 23 wherein said selecting and discretely filtering means comprises means for one of integrating and summing each portion the digital signal to form the plurality of filtered signals in response to at least one enable signal.

26. The wireline receiver circuit according to claim 25 wherein said means for one of integrating and summing one of integrates and sums each different portion of the digital signal in parallel during the enable signal.

27. The wireline receiver circuit according to claim 25 further comprising:
 means for storing the plurality of filtered signals in response to at least one enable signal.

28. The wireline receiver circuit according to claim 27 further comprising:
 means for clearing at least one of the plurality of filtered signals stored in response to at least one reset signal.

29. The wireline receiver circuit according to claim 23 wherein said selecting and discretely filtering means comprises means for matched filtering.

30. The wireline receiver circuit according to claim 23 wherein selecting and discretely filtering means comprises:
 means for differentiating the differential portions of the digital signal; and
 means for integrating the differential portions of the digital signal.

31. The wireline receiver circuit according to claim 30 wherein said means for differentiating comprises at least two switches that receive the digital signal to a gate of each of said at least two switches.

32. The wireline receiver circuit according to claim 30 wherein said means for integrating comprises at least one capacitor; and said means for providing a current definition comprises at least one dummy transistor.

33. The wireline receiver circuit according to claim 23 wherein said means for sampling comprises means for enabling said means for sampling.

34. The wireline receiver circuit according to claim 33 wherein said means for sampling further comprises at least one of:
 a input differential switch pair that receives at least one of the plurality of filtered signals; and
 means for boosting at least one of the plurality of filtered signals.

35. A receiver comprising The wireline receiver circuit according to claim 23.

* * * * *